United States Patent
Benichou et al.

(10) Patent No.: US 10,626,728 B2
(45) Date of Patent: Apr. 21, 2020

(54) BLADE FOR A TURBOMACHINE IMPELLER AND METHOD FOR MODELLING THE SAME

(71) Applicant: SNECMA, Paris (FR)

(72) Inventors: Sami Benichou, Le Blanc-Mesnil (FR); Christian Bariaud, Orsay (FR); Stéphanie Deflandre, Conflans Saint Honorine (FR); Sébastien Digard Brou De Cuissart, Blackrock (IE); Patrick Emilien Paul Emile Huchin, Tessancourt sur Aubette (FR)

(73) Assignee: Safran Aircraft Engines, Paris (FR)

( * ) Notice: Subject to any disclaimer, the term of this patent is extended or adjusted under 35 U.S.C. 154(b) by 509 days.

(21) Appl. No.: 15/104,904

(22) PCT Filed: Dec. 8, 2014

(86) PCT No.: PCT/FR2014/053204
§ 371 (c)(1),
(2) Date: Jun. 15, 2016

(87) PCT Pub. No.: WO2015/092204
PCT Pub. Date: Jun. 25, 2015

(65) Prior Publication Data
US 2017/0122108 A1    May 4, 2017

(30) Foreign Application Priority Data

Dec. 18, 2013  (FR) ..................... 13 62899

(51) Int. Cl.
*G06G 7/48*   (2006.01)
*F01D 5/14*   (2006.01)
(Continued)

(52) U.S. Cl.
CPC ............... *F01D 5/147* (2013.01); *F01D 5/02* (2013.01); *F01D 5/143* (2013.01); *F01D 5/225* (2013.01);
(Continued)

(58) Field of Classification Search
None
See application file for complete search history.

(56) References Cited

U.S. PATENT DOCUMENTS 4,602,412 A * 7/1986 Partington ............. F01D 5/225
29/525
5,593,282 A * 1/1997 Krueger ................. F01D 5/225
416/219 R
(Continued)

FOREIGN PATENT DOCUMENTS

CN    1880729 A    12/2006
EP    1734227 A1   12/2006
(Continued)

OTHER PUBLICATIONS

First Office Action and English translation dated Apr. 5, 2017, in corresponding Chinese Application No. 201480069669.4 (18 pages).
(Continued)

*Primary Examiner* — Cedric Johnson
(74) *Attorney, Agent, or Firm* — Bookoff McAndrews, PLLC (57) ABSTRACT

A blade for a turbomachine bladed wheel, the blade comprising a root, an airfoil, and a tip. The root and the tip have respective platforms, each presenting a surface on a side toward the airfoil, which surfaces are referred to respectively as the root platform wall and the tip platform wall. Each of these platform walls is constituted by a pressure side portion and a suction side portion meeting at a crest curve.

15 Claims, 3 Drawing Sheets

(51) Int. Cl.
*F01D 5/22* (2006.01)
*F01D 5/30* (2006.01)
*G06F 30/00* (2020.01)
*F01D 5/02* (2006.01)

(52) U.S. Cl.
CPC .......... *F01D 5/3007* (2013.01); *G06F 30/00* (2020.01); *F05D 2220/30* (2013.01); *F05D 2230/50* (2013.01)

(56) References Cited

U.S. PATENT DOCUMENTS

| | | | | |
|---|---|---|---|---|
| 6,542,859 | B1* | 4/2003 | Burns | G06F 17/5018 703/7 |
| 2009/0285690 | A1* | 11/2009 | Brown | F01D 5/02 416/219 R |
| 2011/0208497 | A1* | 8/2011 | Sautreau | G06T 17/30 703/6 |
| 2012/0051930 | A1* | 3/2012 | Pandey | F01D 5/143 416/223 A |

FOREIGN PATENT DOCUMENTS

| | | |
|---|---|---|
| GB | 2293212 A | 3/1996 |
| JP | S61103503 U | 3/1986 |
| JP | 2011074837 A | 4/2011 |

OTHER PUBLICATIONS

Translation of Notice of Rejection (Official Action) for corresponding Japanese Application No. 2016-541041, dated Oct. 23, 2018 (6 pages).

International Search Report in corresponding International Application No. PCT/FR2014/053204 dated Mar. 19, 2015 (5 pages—English Translation included).

\* cited by examiner

BLADE FOR A TURBOMACHINE IMPELLER AND METHOD FOR MODELLING THE SAME

CROSS-REFERENCE TO RELATED APPLICATIONS

This application is the U.S. national phase entry under 35 U.S.C. § 371 of International Application No. PCT/FR2014/053204, filed on Dec. 8, 2014, which claims priority to French Patent Application No. 1362899, filed on Dec. 18, 2013.

The present invention relates to a blade for a bladed wheel of a turbomachine; the blade comprising in succession in a radial direction of the wheel, a root, an airfoil, and a tip; the root having a root platform presenting a surface on a side toward the airfoil, which surface is referred to as the root platform wall; the tip having a tip platform presenting a surface on a side toward the airfoil, which surface is referred to as a tip platform wall; and the airfoil having an outer surface referred to as the airfoil surface and comprising a pressure side and a suction side.

The term "platform wall" is thus used herein to mean the surface of a blade platform that faces the airfoil.

Such a blade may be designed to form part of a rotor wheel that receives energy coming from the fluid stream passing therethrough or that imparts energy to that stream; it could also form a portion of a stator wheel of vanes, that serve to guide the stream.

Such a blade having both a tip platform and a root platform is a part that is complex in shape. It is relatively difficult to fabricate, and usually requires the use of molds or tooling made up of multiple parts, and/or possibly involving recourse to five-axis machining centers.

The object of the invention is thus to remedy those drawbacks and to propose blades for which fabrication is simplified or facilitated compared with conventional blades.

In a blade of the type presented in the introduction, this object is achieved by the fact that each of said platform walls is constituted by a pressure side portion on the pressure side and a suction side portion on the suction side, which portions meet at a crest curve going from an upstream edge to a downstream edge of the platform wall and passing through the airfoil; and every point of a first surface selected from the pressure side surface and the suction side surface, and every point of said root and tip platform wall portions situated on the same side as the first surface, referred to as first portions, presents a normal forming an acute angle or a right angle relative to a direction referred to as a first fabrication direction.

The fact that the pressure side portion is on the pressure side and the suction side portion is on the suction side means that the pressure side portion comprises at least that portion of the platform wall that is situated facing the pressure side and the suction side portion comprises at least that portion of the platform wall that is situated facing the suction side.

The crest curve generally extends substantially from the leading edge of the blade to a point on the upstream edge of the platform that is substantially in register with the leading edge of the blade; and likewise the crest curve generally extends substantially from the trailing edge of the blade to a point on the downstream edge of the platform that is substantially in register with the trailing edge of the blade.

Furthermore, the fact that a point on a surface presents a normal forming an acute angle or a right angle relative to a fabrication direction means that at that point the surface does not present any undercut relative to the fabrication direction under consideration.

Consequently, the above definition implies that the first surface, and the platform wall portions situated on the same side as the first surface (first platform wall portions), do not present any undercut relative to the first fabrication direction.

Because of this, the entire portion of the blade that is defined by these surfaces can be made in relatively simple manner.

Preferably, in addition, every point of the second surface of the airfoil, other than the first surface, and every of said root and tip platform wall portions situated on the same side as the second surface presents a normal forming an acute angle or a right angle relative to a direction referred to as a second fabrication direction.

Because of this, the blade can be fabricated in relatively simple manner since the surface of the blade presents a first portion on the same side as the first surface having surfaces that do not present any undercut relative to the first fabrication direction, and a second portion on the same side as the second surface having surfaces that do not present any undercut relative to the second fabrication direction, these portions are thus relatively easy to make.

That said, it results from the way the blade is designed that the platform wall generally presents a slope discontinuity on either side of the crest curve.

Nevertheless, a portion of the crest curve is situated inside the airfoil: as a result a portion of this discontinuity does not occur on the platform walls themselves and does not disturb the flow of fluid over the surfaces of the platform.

Conversely, outside the airfoil, this embodiment can have the consequence that the root platform and/or the tip platform presents an edge or possibly two edge portions, one upstream from the airfoil and the other downstream from the airfoil. These edges constitute the upstream and downstream portions of the crest curve which divides the platform wall into a pressure side portion and a suction side portion.

The upstream edge then extends from the airfoil (generally from the leading edge of the airfoil) to the upstream edge of the platform in question; the downstream edge extends from the airfoil (from the trailing edge) to the downstream edge of the platform in question. The above-mentioned crest curve, where the (tip or root) platform wall portions situated respectively on the pressure side and the suction side meet, runs along these upstream and downstream edges.

It is found advantageously that the presence of edges upstream from the leading edge of the airfoil or downstream from its trailing edge, generally does not significantly degrade the performance of the blade.

In order to simplify fabrication of the blades, the first and second fabrication directions in radial view are preferably parallel and in opposite directions.

Furthermore, in order to simplify fabrication of the blades, the first and second fabrication directions are preferably symmetrical about a midplane of the airfoil (the term "midplane of the airfoil" is used herein to mean a plane close to a mean plane of the airfoil).

Furthermore, fabrication of the blade is facilitated when a large fraction of the surface of the platform wall presents a sufficient clearance angle relative to the fabrication direction envisaged for the surface in question. Conversely, the clearance angle over the platform wall should preferably remain as small as possible in order to avoid disturbing the aerodynamic flow of fluid in the vicinity of the platform wall.

In order to reconcile these requirements in optimum manner, in an embodiment, over a portion of axial extent of the blade, or indeed over the entire axial extent of the blade, a section of the pressure side and/or suction side portion of one of said platform walls in a plane containing the first fabrication direction and a direction that is radial for the blade is constituted by a straight line segment.

The blade is designed to be incorporated in a turbomachine bladed wheel comprising a predetermined number of blades, written N.

In an embodiment, the edge defining the platform wall of a platform (referred to as the "first" platform; it may be the root platform or the tip platform) on the pressure side coincides substantially with the edge defining the platform wall of the first platform on the suction side, after rotation through 360°/N. (The same arrangement may be adopted for the other platform, if the blade has two platforms.)

Consequently, and advantageously, when two blades of this type are placed next to each other (a first blade and a second blade), in the same position as when they are assembled together in the bladed wheel, the slope discontinuity at the interface between the two blades between the first platform on the pressure side of the first blade, and the second platform on the suction side of the second blade, takes place in the recess formed at the interface between the two blades.

Since this zone is recessed, the slope discontinuity at this location does not excessively disturb the flow of fluid between the blades, and does not reduce the performance of the bladed wheel unacceptably.

The invention also provides a bladed wheel comprising a plurality of blades as defined above, and also a turbomachine having such a bladed wheel, in particular for a low pressure turbine.

A second object of the invention is to provide a modeling method for modeling a blade comprising in succession a root, an airfoil, and a tip, an outside surface of the blade being constituted by a suction side and by a pressure side, the method enabling a blade to be defined that is particularly easy to fabricate, in particular in comparison with prior art blades.

This object is achieved when the blade platform wall is modeled by performing the following steps:

a) creating a CAD model of a first surface selected from the pressure side and the suction side in such a manner that every point of the first surface presents a normal forming an acute angle or a right angle relative to a direction referred to as the first fabrication direction; and b) creating a CAD model of root and tip platform walls of the blade in such a manner that each of said platform walls is constituted by a pressure side portion on the pressure side and a suction side portion on the suction side, which portions meets at a crest curve going from an upstream edge to a downstream edge of the platform wall passing through the airfoil; and that every point on the first surface and every point of said root and tip platform wall portions situated on the same side as the first surface presents a normal forming an acute angle or a right angle relative to the first fabrication direction.

This method makes it possible to create a CAD model for a blade as defined above. The term "CAD" model is used to mean a three-dimensional digital model of the kind that can be created in particular by means of computer assisted design software.

A particularly effective method for creating platform walls consists in creating them starting firstly from a "crest" curve situated (circumferentially) at the airfoil, and secondly from limitation curves that define the platform wall on the pressure side and on the suction side respectively at its interfaces with the adjacent blade.

The CAD model of one of the platform walls (for the root or for the tip) may be created in particular from a crest curve, which is created or obtained by shifting or moving in translation a construction curve.

By way of example, the construction curve may be created on a theoretical platform wall surface representing an ideal theoretical shape for a casing passing the fluid.

It is also possible to create a theoretical platform wall surface from curves defining two adjacent blades, i.e. limitation curves.

The construction curve and the limitation curves as created in this way are radially at substantially the same level. That is why the crest curve is created by radially shifting or moving in translation the construction curve: this operation makes it possible to create a radial position difference between these curves, making it possible, as explained below, to ensure that a sufficient clearance angle is present on the surface of the created platform wall.

Preferably, the construction curve is created in such a manner that it crosses right through the theoretical airfoil surface. Thus, as explained above, the slope discontinuity that occurs generally at the crest curve is masked in part by the fact that it takes place on either side of the airfoil.

With reference to the limitation curves, it is possible to create two of them, as explained above, i.e. one on the pressure side and one on the suction side.

Nevertheless, it is preferable to create the limitation curves in such a manner that the limitation curve defining the platform wall on the pressure side coincides (ignoring interblade clearance) with the limitation curve defining the suction side of the platform wall, ignoring rotation through 360°/N.

The platform walls may be constructed in various different ways.

In one implementation, the CAD model of at least one of said portions of one of the platform walls is obtained by sweeping a straight line segment that moves while bearing against two curves.

The term "bearing against" is used herein to mean that the straight line segment is at all times in contact with the two curves.

The straight line segment moves while remaining at all times in a plane perpendicular to the axis of the wheel.

The first of the curves used for sweeping is preferably the above-described crest curve.

The second of these curves is preferably the above-described limitation curve.

Preferably, both sides of the blade are modeled using the above-described method.

Under such circumstances, with a first side of the blade being modeled using the above-described method, the second side of the blade is modeled by performing the following steps:

c) creating a CAD model of the second surface selected from among the pressure side and the suction side, other than the first surface, in such a manner that every point of the second surface presents a normal forming an acute angle or a right angle relative to a direction referred to as the second fabrication direction; and in step b), the CAD model of the root and tip platform walls is created in such a manner that every point of the root and tip platform walls on the same side as the second surface presents a normal forming an acute angle or a right angle relative to the second fabrication direction.

In an implementation, the first or second fabrication directions are identical.

The invention also provides a method of fabricating a blade for a turbomachine bladed wheel, the blade comprising a root, a tip, and an airfoil, the method being characterized in that in order to define the blade, it makes use of a modeling method as described above.

The invention also relates to the use, in the CATIA CAD tool, of the platform wall-modeling method as defined above.

Finally, the invention also provides a computer program including instructions for enabling a computer to execute steps of the blade modeling method as defined above, a computer readable data medium storing a computer program as defined above, and a computer including a data medium as defined above.

The invention can be well understood and its advantages appear better on reading the following detailed description of embodiments shown as non-limiting examples. The description refers to the accompanying drawings, in which.

Figure 1:
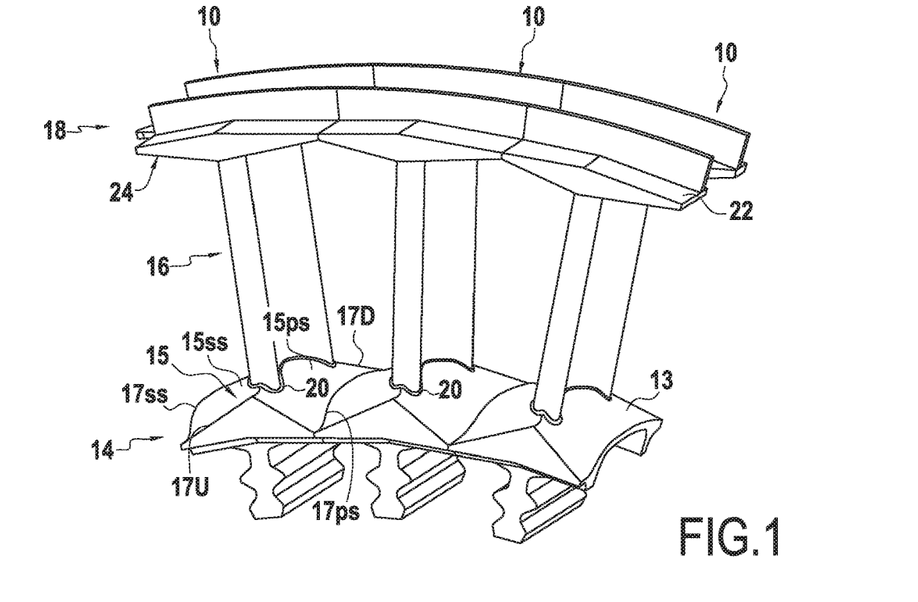
FIG. 1 is a diagrammatic perspective view of a blade of the invention.
Figure 2:
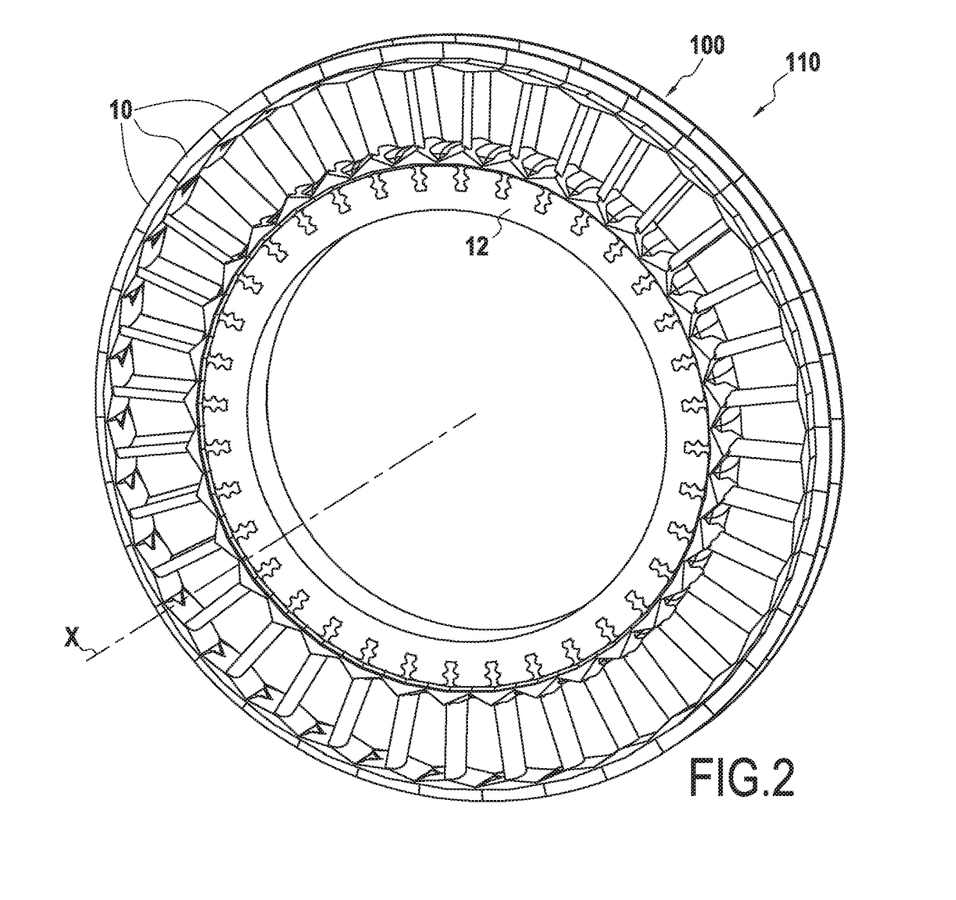
FIG. 2 is a fragmentary diagrammatic perspective view of a turbomachine showing a bladed wheel including blades identical to those shown in FIG. 1.

FIG. 1 shows three identical blades 10 representing an embodiment of the invention. Each of the blades 10 is designed to be assembled together with N−1 identical blades 10 so as to form a bladed wheel 100 comprising N blades 10 (FIG. 2).

The bladed wheel 100 itself forms part of a turbomachine 110.

In the wheel 100, the blades 10 are mounted on a rotor disk 12 in axisymmetric manner around the axis X of the wheel. When the wheel is in use, a fluid stream flows along the axis X from an upstream side to a downstream side of the wheel.

In the description below, elements associated with the upstream side are written "u", while elements associated with the downstream side are written "d".

Each blade 10 comprises in succession in a radial direction going outwards from the wheel: a root 14, an airfoil 16, and a tip 18.

The root 14 and the tip 18 thus constitute the two ends of the blade. They include respective platforms 13 and 22. These platforms 13 and 22 extend in a direction that is generally perpendicular to the longitudinal direction of the airfoil 16 (which is the radial direction R for the blade 10).

The root platform 13 presents a platform wall 15 and the platform 22 of the tip presents a platform wall 24.

Figure 4:
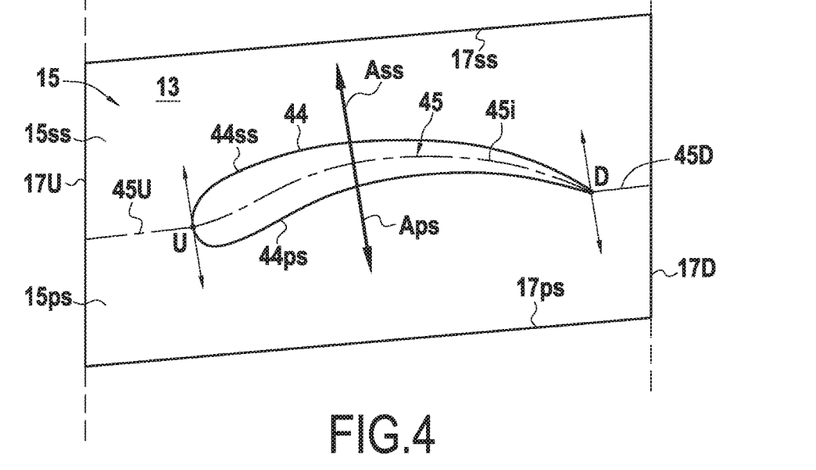
FIG. 4 is a diagrammatic view that is radial relative to the axis of the bladed wheel, showing the digital model of the FIG. 1 blade while it is being created by the modeling method of the invention.

In a radial view (looking along the direction R, as shown in FIG. 4), the platform wall 15 presents an outline with four sides, defined by an upstream edge 17$u$, a downstream edge 17$d$, a pressure side edge 17$ps$, and a suction side edge 17$ss$ (where pressure side elements are referenced "ps" and suction side elements are referenced "ss").

The platform wall 15 is made up of two complementary portions: a pressure side portion 15$ps$ situated on the pressure side and a suction side portion 15$ss$ situated on the suction side of the airfoil.

Between them, these two portions 15$ps$ and 15$ss$ define a crest curve 45$c$.

Figure 3:
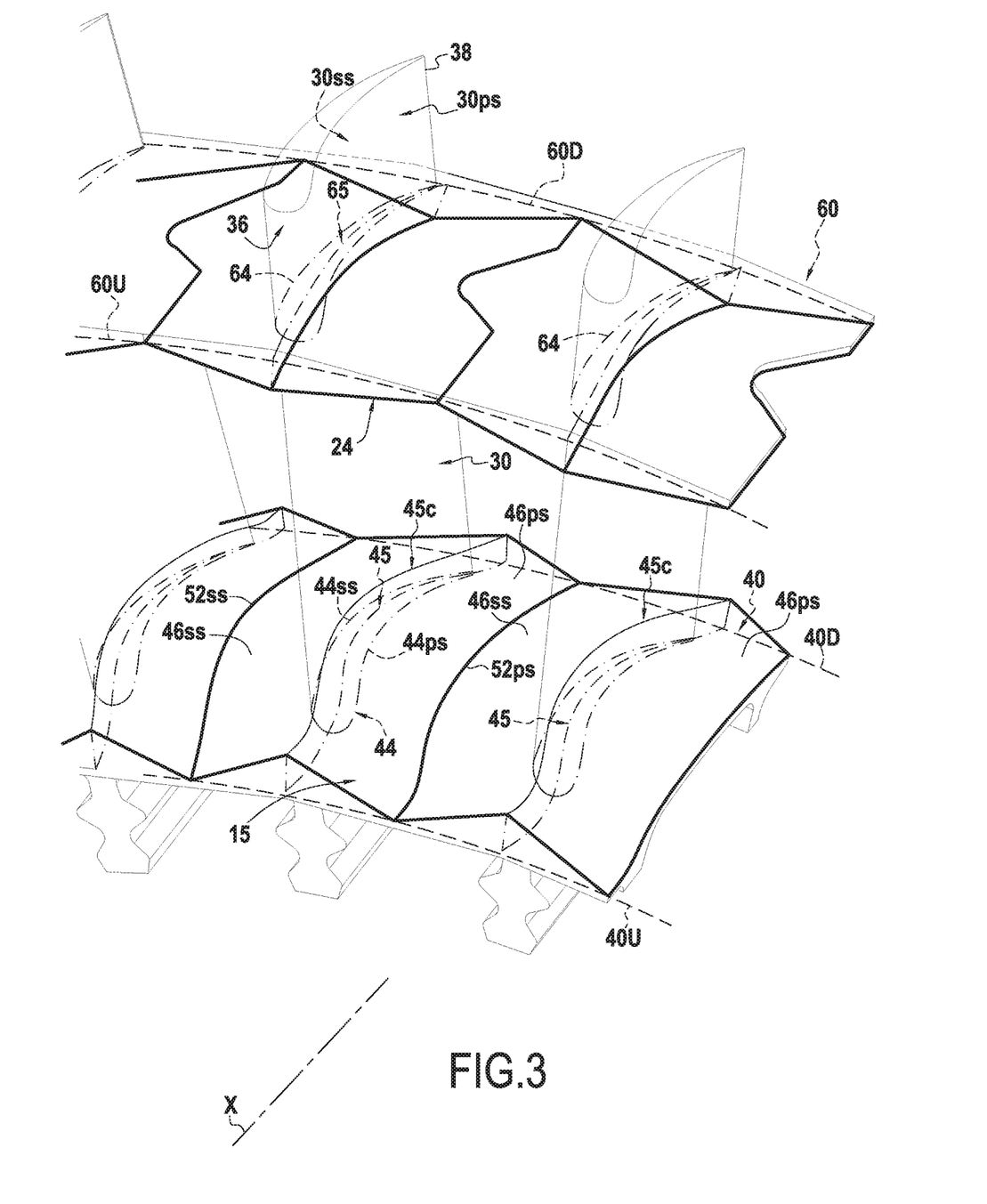
FIG. 3 is a diagrammatic perspective view of a digital model of the FIG. 1 blade while it is being created by the modeling method of the invention.

The platform wall 15 is connected to the surface of the airfoil 16 via connection surfaces 20 (which are connection fillets having varying radii), not shown in FIG. 3.

The modeling method used for defining the shape of the blade 10 in accordance with the invention is described below.

This method comprises the following operations:
a) determining the theoretical surface of the airfoil;
b) determining the theoretical surface of the platform wall;
c) determining the construction curve for the blade; and
d) creating the platform wall.

These operations are performed on a computer, using a computer assisted design program, e.g. such as the CATIA (registered trademark) software.

The various creation operations mentioned below are thus operations of creating three-dimensional entities, which entities are defined in a virtual three-dimensional environment or space.

a) Determining a Theoretical Airfoil Surface

A theoretical airfoil surface 30 is created initially. This surface represents the outside surface desired for the airfoil 16. This surface is a function in particular of the aerodynamic constraints that are applicable to the airfoil; the airfoil is constituted by a suction side 30$ss$ and a pressure side 30$ps$, and it presents a leading edge 36 and a trailing edge 38 (FIG. 3).

b) Determining Theoretical Platform Wall Surface

Thereafter a theoretical root platform wall surface 40 and a theoretical tip platform wall surface 60 are created or determined. Each of these surfaces has substantially the shape desired for the inner or outer casing defining the gas flow passage through the bladed wheel.

The surfaces 40, 60 extend axially upstream and downstream to the crest curves (40U, 40D, 60U, 60D) that define axially the extent and the footprint of the blade that is to be defined.

In the example described, the surfaces 40 and 60 are surfaces of revolution defined around the axis A. That said, theoretical surfaces for the platform wall that are not surfaces of revolution can also be used in the ambit of the invention, for example surfaces leading to defining so-called "3D" platforms that include local projections and/or depressions.

The term "surface of revolution" about an axis is used herein to mean a surface generated by rotating a curve around the axis.

c) Creating Platform Wall Construction Curves

After defining the support entities that are constituted by the theoretical airfoil and platform wall surfaces (30; 40, 60), construction curves 45 and 65 are created respectively for the wall of the platform 13 and for the wall of the platform 22.

For this purpose, the intersection curve 44 is determined between the theoretical airfoil surface 30 and the theoretical root platform wall surface 40.

The intersection curve 64 is also determined between the theoretical airfoil surface 30 and the theoretical tip platform wall surface 60.

Thereafter, fabrication directions Aps and Ass are defined for the blade, respectively on its pressure side and its suction side.

In the implementation of the invention being described, the first and second fabrication directions Aps and Ass on the two sides of the blade are selected to be symmetrical about the plane containing the direction R and perpendicular to the axis X, thereby simplifying fabrication tooling. The fabrication directions correspond to the directions of unmolding, machining, etc., as a function of the fabrication method used.

Figure 5:
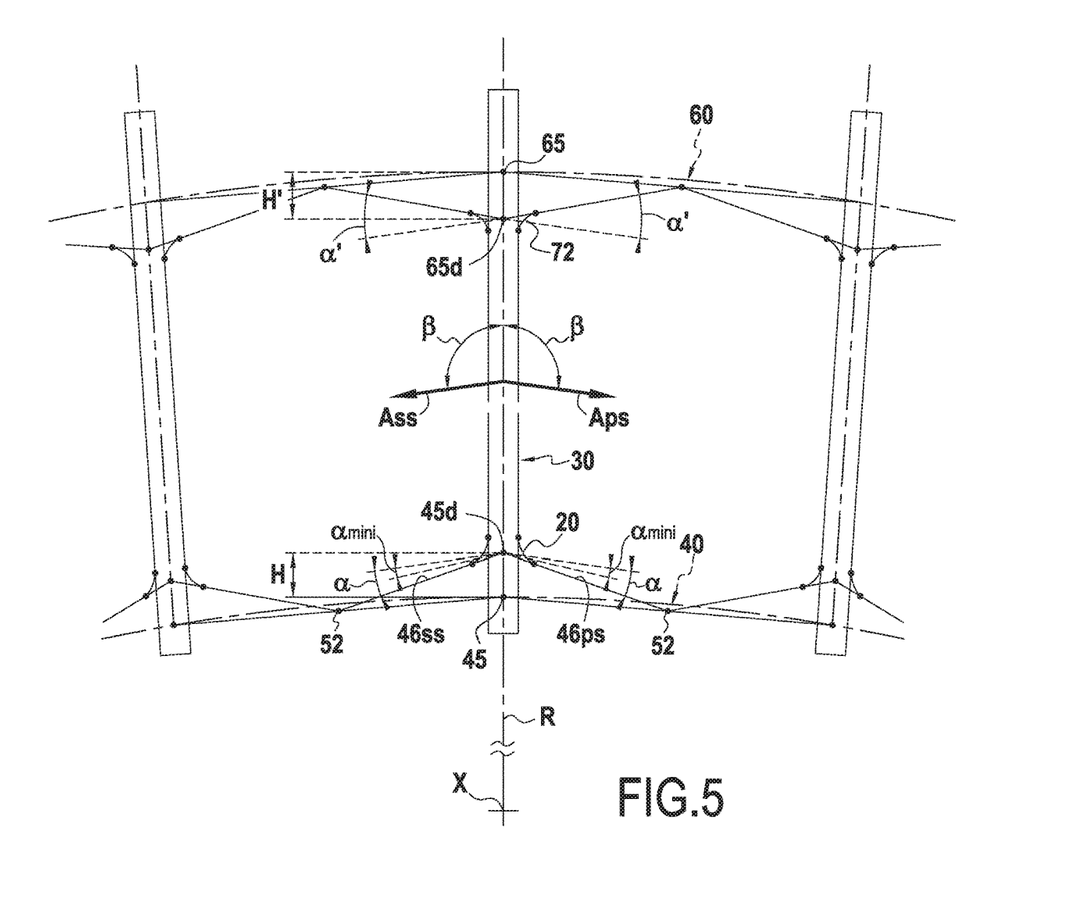
FIG. 5 is a diagrammatic view looking along the axis of the bladed wheel, in the digital model of the FIG. 1 blade while it is being created by the modeling method of the invention.

Consequently, in axial view (in a plane perpendicular to the axis A of the bladed wheel, as shown in FIG. 5), the fabrication directions Aps and Ass form the same angle β relative to the radial direction R.

There follows a detailed description of how the construction curve 45 for the root platform 13 is determined, with the same method then being used for determining the construction curve 65 for the tip platform 22.

For a given intersection curve between the theoretical airfoil surface and a theoretical platform wall surface (in the present example, the intersection curve is the curve 44), the fabrication directions (Aps, Ass) correspond to a pair of points (U, D) referred to as "limit points", that are defined as follows:

A pair of limit points (U, D) is a pair of points generally situated respectively in the vicinity of the leading edge 36 and of the trailing edge 38 of the airfoil, which form portions of the intersection curve under consideration (44), and which subdivide it into two complementary portions (44ps and 44ss) respectively on the pressure side and on the suction side, and such that at every point on each of these portions (44ps and 44ss), the angle between the normal to the theoretical airfoil surface at the point under consideration forms an acute angle or a right angle relative to the fabrication direction A.

In other words, at each point of one of these curve portions, the theoretical airfoil surface presents a non-negative clearance angle relative to the fabrication direction.

In general, this means that in radial view (i.e. looking along the radial direction of the airfoil, as shown in FIG. 4), the tangent to the intersection curve (to the curve 44) at the limit points (U, D) is parallel to the fabrication directions Aps and Ass, as shown in FIG. 4.

Selecting the fabrication directions Aps and Ass makes it possible to define a pair of limit points U, D on the curve 44.

The construction curve 45 for the root platform wall is then defined so as to satisfy the following constraints:
  the curve 45 must pass through the limit points U and D;
  it must extend upstream and downstream to the respective upstream and downstream crest curves 40U and 40D of the theoretical platform wall surface 40; and
  it must connect together the points U and D without passing through the theoretical airfoil surface 30 between these points.

Thus, the construction curve 45 comprises:
  a portion 45i inside the curve 44, having its ends constituted by the points U and D. In radial view (FIG. 4), this curved portion 45i extends inside the curve 44;
  two curved portions 45u and 45d that are formed on the theoretical platform wall surface 40 of the root, respectively from the point U to the curve 40u and from the point D to the curve 40d.

The construction curve 65 for the tip platform 22 is then created in analogous manner.

d) Creating Root and Tip Platform Walls

The root and tip platform walls are created as follows. Only the creation of the root platform wall is described, the tip platform wall being created in analogous manner.

Firstly the limitation curve (referred to generically as the curve 52) that is desired to define the platforms of adjacent blades is created. More precisely, two instances 52ps and 52ss of this limitation curve 52 are created, one on the pressure side and the other on the suction side of the theoretical airfoil surface 30, these two curves being identical to each other, ignoring rotation through an angle of 360°/N about the axis X. These curves 52ps and 52ss are created at the surface of the theoretical surface of the platform wall 40.

A crest curve 45c is created by offsetting the curve 45 radially outwards through a height H of value that is specified below.

Platform wall support surfaces 46ps and 46ss are then created by sweeping straight line segments that move on either side of the theoretical airfoil surface, bearing firstly against the crest curve 45c and secondly against a respective one of the curves 52ps and 52ss.

At each instant, each of these straight line segments remains contained within a plane P perpendicular to the axis X of the wheel.

The value H of the radial offset of the curve 45c is selected as being sufficient to ensure that the platform wall support surfaces 46ps and 46ss present, in any plane P, a clearance angle that is sufficient relative to the unmolding direction A: i.e. in each plane P, the angle α between a point of the section of the platform wall support surface and the unmolding direction A must be greater than the minimum desired clearance angle $\alpha_{mini}$ (in the limit, the desired minimum clearance angle $\alpha_{mini}$ may be equal to 0).

Furthermore, under all circumstances, there must not be any undercut: thus, at each point on each of the platform wall support surfaces 46ps and 46ss, the angle between the normal to the point under consideration and the fabrication direction for the platform wall support surface of which the point forms a part must form an acute angle or a right angle, and must not under any circumstances form an obtuse angle (>90°).

Since the surfaces 46ps and 46ss are created by sweeping straight line segments contained in plane P and that are moved while bearing against two curves, their sections in any plane P are straight line segments.

Nevertheless, the surfaces 46ps and 46ss could equally well be created using any other method appropriate for creating a surface, while remaining within the ambit of the invention.

In particular, it is appropriate to ensure that the above condition is satisfied in each of the planes P, i.e. that in each of the planes, the angle between every point of the section of the platform wall support surface and the fabrication direction in question (Aps or Ass) is greater than the minimum desired clearance angle $\alpha_{mini}$.

Constructing the surfaces 46ps and 46ss by sweeping a straight line segment that bears against two curves, in the manner described above, has the consequence that the surfaces 46ps and 46ss of two adjacent blades present a common limit defined by the curve 52.

If some other method is used for creating the surfaces 46ps and 46ss, it is desirable for the surfaces 46ps and 46ss to be formed in such a manner that there is no discontinuity (at least of position) between two adjacent blades: this means that the edges of the surfaces 46ps and 46ss remote from the airfoil must correspond (or face each other) after rotation through an angle of 360°/N.

On the blades 10, this means that the edges defining the platform wall 15 respectively on the pressure side and on the suction side (references 17*ps* and 17*ss*, both of which are theoretically defined from the curve 52) coincide substantially, ignoring rotation through 360°/N.

Once the platform wall support surfaces 46*ps* and 46*ss* have been created, they need to be limited.

To do this, calculation begins with the surfaces 20 of the connection fillets between the theoretical airfoil surface 30 and the platform wall support surfaces 46*ps* and 46*ss*. The platform wall support surfaces 46*ps* and 46*ss* are limited to the ends of these connection fillet surfaces 20.

Nevertheless, upstream and downstream from the theoretical airfoil surface 30, the platform wall support surfaces 46*ps* and 46*ss* join each other at the curved portions 45*u* and 45*d* of the crest curve 45*c*.

The union between the surfaces 46*ps* and 46*ss* as limited in this way constitutes the platform wall 15 of the platform 13.

The tip platform wall 24 is created in the same manner, as are the connection fillets 72 between the platform wall 24 and the theoretical airfoil surface 30.

While creating the tip platform wall 24, it is therefore necessary to create a crest curve 65*c* by radially offsetting the curve 65 through a value H' (which is not necessarily equal to H).

The radial offset is naturally performed towards the axis X.

Thereafter, on the pressure side and on the suction side and insofar as the curve 45 has been offset through a sufficient height H, the platform wall support surfaces of the tip and root platforms present, in any plane P, a clearance angle relative to the fabrication direction A that is sufficient.

Finalizing the Blade Model

The digital model for the complete blade is then finalized by incorporating therein specifically the platform walls 15 and 24, the connection fillets 20 and 72, and the theoretical airfoil surface 30, once the limitations have been applied.

Fabricating the Blades

The blade 10 can then be fabricated industrially with the shape defined by the CAD model as defined in this way.

The invention claimed is:

1. A blade for a turbomachine bladed wheel; the blade comprising in succession in an outward radial direction of the wheel, a root, an airfoil, and a tip;
    the root having a root platform presenting a surface on a side toward the airfoil, which surface is referred to as a root platform wall;
    the tip having a tip platform presenting a surface on a side toward the airfoil, which surface is referred to as a tip platform wall; and
    the airfoil having an outer surface referred to as an airfoil surface and comprising a pressure side and a suction side;
    wherein each of said platform walls is constituted by a pressure side portion on the pressure side and a suction side portion on the suction side, which portions meet at a crest curve going from an upstream edge to a downstream edge of the platform wall passing through the airfoil,
    at every point of a first surface selected from a surface of the pressure side or a surface of the suction side, and every point of said root and tip platform wall portions situated on the same side as the first surface, a normal, to the surface of the blade forms an acute angle or a right angle relative to a fixed straight direction referred to as a first direction, and wherein at every point of the first surface, and every point of said root and tip platform wall portions situated on the same side as the first surface, a normal to the surface of the blade does not form an obtuse angle relative to the first direction, thereby forming no undercut.

2. The blade according to claim 1, wherein at every point of a second surface of the airfoil selected from the surface of the pressure side or the surface of the suction side, the second surface being another surface than the first surface, and at every point of said root and tip platform wall portions situated on the same side as the second surface, a normal to the surface of the blade forms an acute angle or a right angle relative to a fixed straight direction referred to as a second direction, and
    wherein at every point of the second surface, and every point of said root and tip platform wall portions situated on the same side as the second surface, a normal to the surface of the blade does not form an obtuse angle relative to the second direction, thereby forming no undercut.

3. The blade according to claim 2, wherein, in radial view, the first and second directions are parallel and opposite.

4. The blade according to claim 1, wherein, over a portion of an axial extent of the blade, or indeed on all of the axial extent of the blade, a section of the root platform wall or of the tip platform wall on the first side in a plane containing the first direction and a direction radial for the blade is constituted mainly by a straight line segment.

5. The blade according to claim 1, for a turbomachine bladed wheel having N blades, and wherein an edge defining the platform wall of a first platform of the blade on the pressure side coincides with an edge defining the platform wall of the first platform of the suction side, after a rotation through 360°/N.

6. A bladed wheel comprising a plurality of the blades according to claim 1.

7. A turbomachine including the bladed wheel according to claim 6.

8. A modeling method for modeling a blade comprising in succession a root, an airfoil, and a tip, an outside surface of the blade being constituted by a suction side and by a pressure side, the method being characterized in that it comprises the following steps:
    a) creating a CAD (computer-aided design) model of a first surface selected from a surface of the pressure side and a surface of the suction side in such a manner that at every point of the first surface, a normal to the surface of the blade forms an acute angle or a right angle relative to a fixed straight direction referred to as a first direction, wherein no undercut is formed at said every point with respect to the first direction; and
    b) creating a CAD model of root and tip platform walls of the blade in such a manner that each of said platform walls is constituted by a pressure side portion on the pressure side and a suction side portion on the suction side, which portions meet at a crest curve going from an upstream edge to a downstream edge of the platform wall passing through the airfoil; and that at every point on the first surface and every point of said root and tip platform wall portions situated on the same side as the first surface, a normal to the surface of the blade forms an acute angle or a right angle relative to the first direction, and wherein at every point of the first surface, and every point of said root and tip platform wall portions situated on the same side as the first surface, a normal to the surface of the blade does not form an obtuse angle relative to the first direction, thereby forming no undercut.

9. The modeling method according to claim 8, wherein in step b), a CAD model of one of said platform walls is created from the crest curve, which is obtained by shifting or moving in translation a construction curve.

10. The modeling method according to claim 9, wherein in step b), the construction curve is created in such a manner that it crosses right through a theoretical airfoil surface.

11. The modeling method according to claim 8, wherein, in step b), one of said platform walls is created in such a manner that a limitation curve defining said platform wall on the pressure side coincides with a limitation curve defining said platform wall on the suction side, excluding a rotation of 360°/N.

12. The modeling method according to claim 8, wherein, in step b), the CAD model of at least one of said portions of one of said platform walls is obtained by sweeping a straight line segment that moves while bearing against two curves.

13. A modeling method for modeling a blade in which a first side of a blade is modeled using the method according to claim 8, the method further comprising the following steps:
   c) creating a CAD model of a second surface selected from among the pressure side and the suction side, other than the first surface, in such a manner that at every point of the second surface, a normal to the surface of the blade forms an acute angle or a right angle relative to a fixed straight direction referred to as a second direction; and wherein, in step b), the CAD model of the root and tip platform walls is created in such a manner that at every point of the root and tip platform walls on the same side as the second surface, a normal to the surface of the blade forms an acute angle or a right angle relative to the second direction, and wherein at every point of the second surface, and every point of said root and tip platform wall portions situated on the same side as the second surface, a normal to the surface of the blade does not form an obtuse angle relative to the second direction, thereby forming no undercut.

14. The modeling method according to claim 13, wherein the first and second directions are identical.

15. A method of fabricating a blade for a turbomachine bladed wheel, the blade comprising a root, a tip, and an airfoil, the method being characterized in that in order to define the blade, use is made of the modeling method according to claim 8.

* * * * *